United States Patent [19]

Medwin

[11] 4,110,701
[45] Aug. 29, 1978

[54] METHOD AND APPARATUS FOR NEAR-SYNCHRONIZATION OF A PAIR OF OSCILLATORS, AND MEASURING THEREBY

[75] Inventor: Albert H. Medwin, Princeton, N.J.

[73] Assignee: CGS Systems, Inc., Princeton, N.J.

[21] Appl. No.: 776,841

[22] Filed: Mar. 14, 1977

[51] Int. Cl.² .................. G01R 27/26; H03B 3/04
[52] U.S. Cl. ......................... 331/1 A; 324/61 R; 331/14; 331/34; 331/65; 331/108 D; 331/111; 331/177 R
[58] Field of Search ............... 331/1 A, 14, 34, 55, 331/65, 172, 173; 324/61 R, 61 P, 61 QS, 61 QL; 177/25, 210 C, 210 FP

[56] References Cited

U.S. PATENT DOCUMENTS

| 3,185,938 | 5/1965 | Pelosi | 331/14 X |
| 3,314,493 | 4/1967 | Kennedy | 177/210 C |
| 3,893,040 | 7/1975 | Harp | 331/14 |

Primary Examiner—Siegfried H. Grimm
Attorney, Agent, or Firm—Irons and Sears

[57] ABSTRACT

The measuring system of the disclosure has two oscillators of different frequencies. The oscillations of the high frequency oscillator are counted for a time corresponding to a portion, for example one-eighth, of the period of the low frequency oscillator. If the count is less or greater than a selected count, for example 4,096, the frequency of the low frequency oscillator is corrected by approximately one high frequency period in the one-eighth low frequency period. By this method the oscillators are brought into near-synchronism, so that there are counted exactly 4,096 high frequency oscillations during the one-eighth period of the low frequency oscillator, but neither 4,097 or more, nor 4,095 or less. The correction is accomplished by excluding or including one at a time, various resistors in the frequency determining portion of the low-frequency circuit by the use of transmission gates in parallel with the resistors. The system may be used to measure, for example, weight. The capacity in the frequency determining portion of the high frequency oscillator is increased as a function of the weight. The frequency of the high frequency oscillator is thereby reduced. Suitable circuits respond to count the changed oscillations relative to the unchanged calibration period of the low frequency oscillator to derive a measure of the weight.

27 Claims, 7 Drawing Figures

METHOD AND APPARATUS FOR NEAR-SYNCHRONIZATION OF A PAIR OF OSCILLATORS, AND MEASURING THEREBY

BACKGROUND OF THE INVENTION

This invention relates to measuring or the like. In the past it has been known to measure various parameters by measuring an oscillator frequency which is responsive to the parameter under test or to be measured. The change in frequency as a result of a change in the parameter could be measured or counted, and the value of the change in the parameter could be deduced. One way of making the measurement was to use a pair of oscillators. One oscillator is usually a "reference" or standard; i.e., a crystal controlled precision oscillator. The oscillators were synchronized by known techniques so as to stabilize one oscillator relative to the other by developing an analog voltage representing the required correction, and applying it to one of the oscillators, usually the non-standard, which would be responsive to such a voltage in order to bring the two oscillators into synchronism. Accordingly the one oscillator would be stabilized relative to the other. Consequently when, after synchronization, the oscillators were dissociated, there was a change in the frequency of one of those oscillators caused by a change in the parameter to be measured, the difference in frequency between the two oscillators could be measured or counted, by measuring the frequency of one against the other, to give the change in the parameter under test. Various other devices are known for synchronizing two such oscillators or stabilizing an oscillator and then measuring or counting the change in the frequency caused by a change in the parameter under test. There are known various systems for controlling frequency, such as represented by voltage-controlled oscillators, variable reactances and the like. The following patents may be considered as representative:

U.S. Pat. Nos. 3,761,810 to Fathauer, Sept. 25, 1973; U.S. Pat. 3,794,911 to Fathauer, Feb. 26, 1974; U.S. Pat. 3,888,473 to Heyck, May 27, 1975; U.S. Pat. 3,967,690 to Northcutt, July 6, 1976; U.S. Pat. 3,893,040 to Harp, July 1, 1975; U.S. Pat. 3,488,605 to Schwartz, Jan. 6, 1970; and U.S. Pat. 3,370,252 to Zoerner, Feb. 20, 1968. Also of interest are the following patents: U.S. Pat. Nos. 3,227,952 to Proebster et al, Jan. 4, 1966; U.S. Pat. 3,370,252 to Zoerner, Feb. 20, 1968; U.S. Pat. 3,392,348 to Horwitz, July 9, 1968; U.S. Pat. 3,484,712 to Foote et al, Dec. 26, 1969; and U.S. Pat. 3,875,525 to Ballinger et al, April 1, 1975; and also German Pat. No. 2,333,196 to Ise Electronics Corporation of Japan laid open on Jan. 24, 1974, which shows a digital bathroom scale which may be of some interest here because the present application illustrates the invention herein as related to a weighing device.

SUMMARY OF THE INVENTION

According to the present invention a pair of oscillators are employed one being brought into near synchronism with the other by counting pulses from the one oscillator for a selected multiple (which may be more or less than unity) of the period of the other oscillator. In accordance with whether this count is high or low, one of these oscillators is corrected by a single selected increment, preferably equal or approximately equal to one period of the higher frequency of the oscillators. Accordingly on the next count the oscillators are brought more nearly into synchronism by the one increment. The process is continued until the portion of the period of the one oscillator is equal to the selected multiple of the period of the other oscillator within one increment, preferably within one high frequency period. Advantage is now taken of the near-synchronization of the two oscillators to secure a measure of the parameter under test. When the parameter changes it causes a change in the frequency of the oscillator. The changed high frequency oscillations are now counted for a time defined by the oscillations of the oscillator of unchanged frequency, thereby obtaining a count which is indicative of the change in the parameter under test.

More specifically in the illustrative embodiment, a selected multiple of the high frequency oscillations and a selected portion of the low frequency oscillations are brought into near synchronism by changing the frequency of the low frequency oscillator a single increment (substantially equal to the period of a high period oscillation) at a time. Then the high frequency oscillator frequency is changed by varying the parameter under test, for example, the weight applied to a capacitor in the frequency determining circuit of the low frequency oscillator. The capacitor may be the capacity between a pair of plates arranged to remain parallel by a suitable mechanical linkage, and separated by a resilient means, such as a sponge rubber pad. A weight upon the top plate closes it toward the bottom plate thereby increasing the capacity in the frequency determining circuit of the high frequency oscillator. Typically the change in frequency of the high frequency oscillations is substantial, for example one or more orders of magnitude. Therefore it is readily possible for the circuits to respond to such change by providing a measurement cycle, during which the oscillators are temporarily dissociated during the weighing. By counting the change in the frequency of high frequency oscillations during the selected portion of the low frequency oscillations, the change in the variable capacity and therefore the weight upon the top plate may be deduced and suitably displayed. Other parameters may be tested in like fashion. For example if a resistor in one of the frequency determining circuits is a thermistor, then changes in temperature may be quantitatively measured; pressure or other parameters may also be measured.

DESCRIPTION OF THE DRAWINGS

The objects, advantages, and novel features of the invention will be more fully apparent from the following detailed description when read with reference to the accompanying drawings in which:

FIGS. 5, 6, and 7 are timing diagrams useful in explaining the operation of the circuitry.

DETAILED DESCRIPTION

Figure 1:
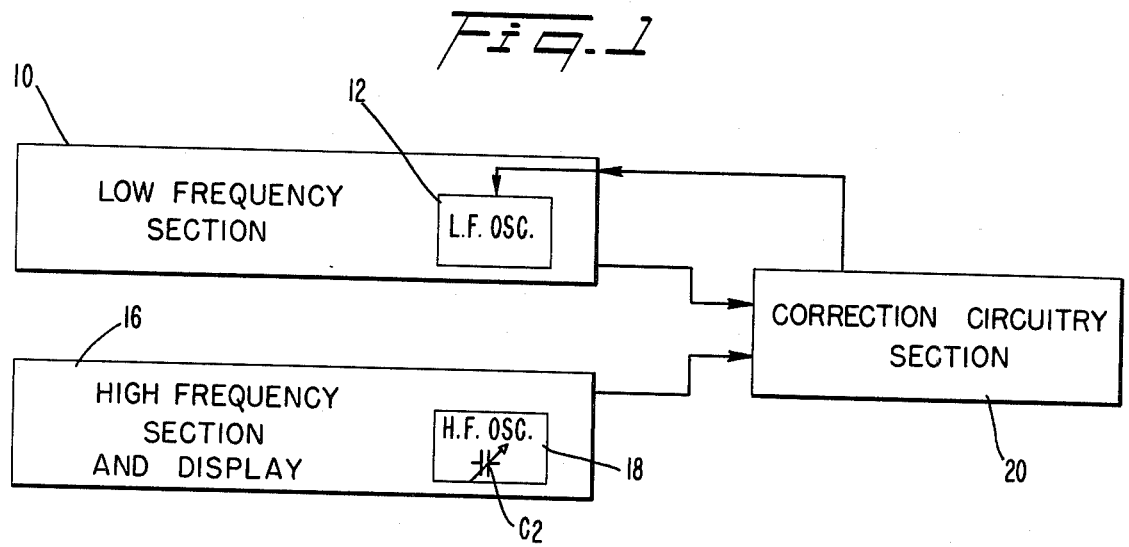
FIG. 1 is a block diagram of an embodiment of the invention.

Block Diagram — FIG. 1

Referring now to FIG. 1, a low frequency section 10 includes a low frequency oscillator 12. A high frequency section 16 includes a high frequency oscillator 18. Part of the frequency-determining circuit of the high frequency oscillator 18 is a variable capacitor C2. The high frequency section 16 may include counters and a display. Correction circuitry section 20 is connected to receive information from the low frequency section 10 and the high frequency sections 16 and return correction signals to the low frequency oscillator 12.

In operation the low frequency oscillator 12 and the high frequency oscillator 18 are free running oscillators. A certain portion of the period of the low frequency oscillator is selected so that it is approximately equal to a selected number of the oscillations of the high frequency oscillator 18. If the number of high frequency oscillations is less or more than the selected number on comparison in the correction circuitry section 20 the deficiency or excess is sensed and the low frequency oscillator receives a signal from the correction circuitry section 20 causing an incremental change in the period of the low frequency oscillator. The change in period is such that the change in the count of the high frequency oscillations during the selected portion of the low frequency oscillator period is approximately equal to one high frequency oscillation period. Accordingly on the next comparison count of the selected number of high frequency oscillation periods with the selected portion of the low frequency oscillator period, the deficiency or excess is corrected by one increment, in this case approximately equal to one high frequency period and in the direction either lengthening or shortening, to bring the two oscillators into near synchronism. The method is repeated until the selected number of high frequency oscillation periods is equal to the selected portion of the low frequency oscillator period within the selected increment. It is equally possible to make corrections in the high frequency oscillation periods to the same purpose. Nevertheless because it is easier to correct the period of the low frequency oscillator for a small portion of time, I prefer to correct the period of the low frequency oscillator. The manner in which the circuits operate will be more fully apparent from the detailed description which follows.

There are other interconnections beetweeen the low frequency section 10, the high frequency section 16, and the correction circuitry section 20 which are not completely shown in FIG. 1 as not necessary at this point for the introductory explanation.

In the embodiment described, the circuits are shown as logic elements. The details of these may be obtained from a manufacturer's or text book disclosure. In order to disclose a specific embodiment particular logic circuits are indicated. The arrangement lends itself particularly well to so called CMOS or COSMOS (complementary symmetry metal oxide semiconductor) circuitry, and if desired may be reduced to a single integrated circuit chip except for the variable capacitor used as a weighing device. Power supplies and ground are not illustrated, such details being readily supplied by those skilled in the art.

Figures 2, 3:
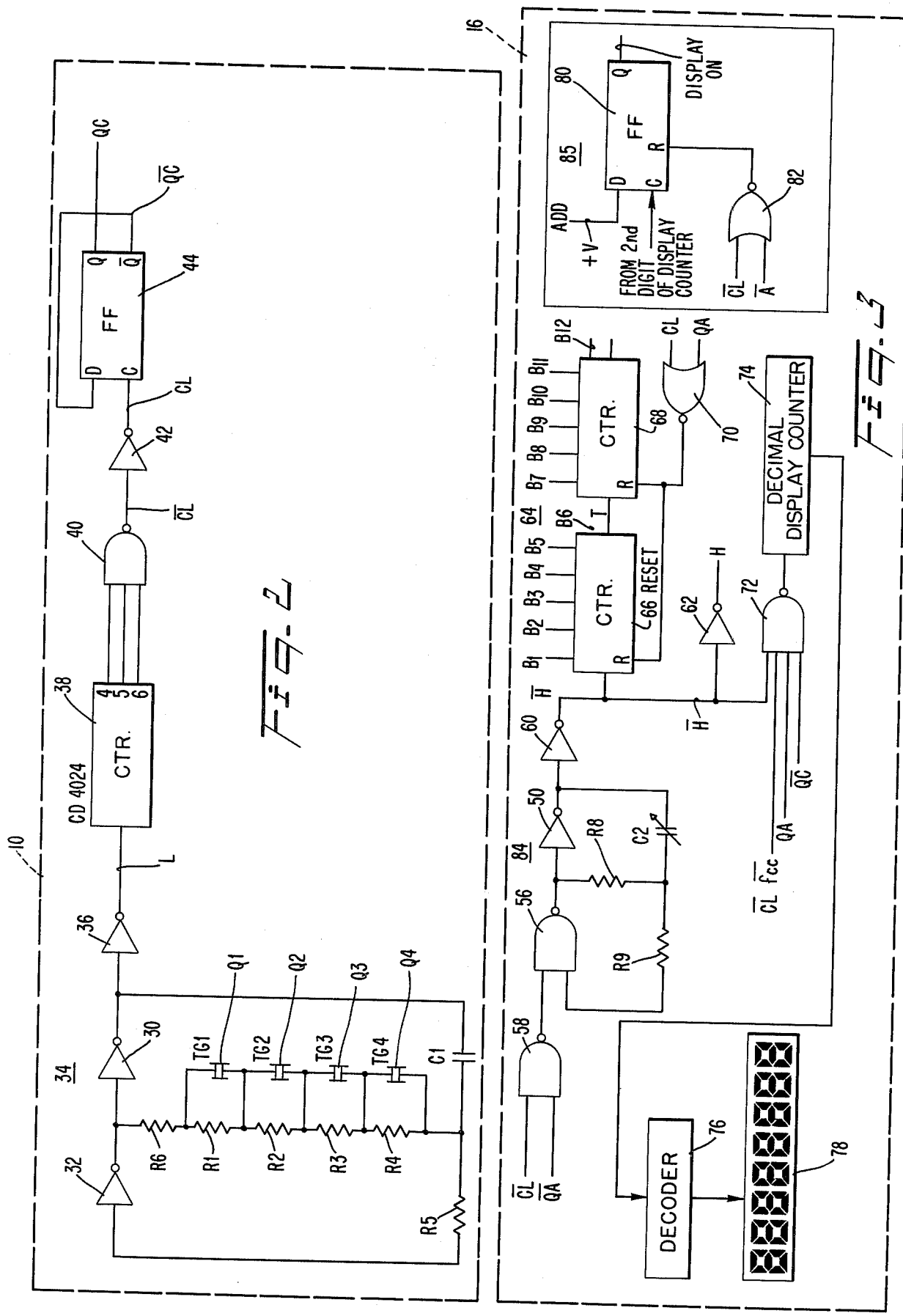
FIG. 2 is a logic diagram schematically illustrating a low frequency section of the block diagram of FIG. 1.

Low Frequency Section 10 — FIG. 2

Referring now to FIG. 2, the low frequency section 10 comprises an inverter amplifier 30 which has its output connected through the series combination of a capacitor C1 and a resistor R5 to the input of another inverter amplifier 32. Each of the inverter amplifiers described herein are an RCA type 4049. The output of inverter amplifier 32 is connected to the input of inverter amplifier 30. The output of inverter amplifier 32 is also connected through series connected resistors R6, R1, R2, R3, and R4 to the junction between capacitors C1 and resistor R5. C1 has a value of 5600 micromicrofarads. The value of R5 is 100 kilohms, the value of R6 is 220 kilohms, and the value of each of resistors R1 through R4 is 1000 ohms. Each of the resistors R1 through R4 are paralleled respectively by transmission gates TG1, TG2, TG3, and TG4. The transmission gates are each one-forth of an RCA type 4016. The circuitry thus far described in FIG. 2 constitutes a low frequency oscillator 34 the frequency of which is determined in large part by the capacitor C1 and the resistors R1 through R4 and R6.

The output of the low frequency oscillator 34 at the output of the inverter amplifier 30 is connected to another inverter amplifier 36. The output of inverter amplifier 36, designated L for the low frequency oscillation signal, is applied to a seven-stage counter 38 which is an RCA type CD 4024, the last stage not being used. The fourth, fifth and sixth stages of the binary counter 38 have their "one" outputs applied to a three-input nand gate 40. All of the three-input nand gates are one-third of an RCA type CD4023. The output of the three-input nand gate 40 designated not-CL ($\overline{CL}$) is applied to the input of an inverter amplifier 42 the output of which is designated CL and applied to the C or clock input of a so-called master slave flip-flop 44. All the flip-flops herein are each one-half of an RCA type CD4013. The not-Q ($\overline{Q}$) output signal, designated not-QC ($\overline{QC}$) is applied to the D or data input of the flip-flop 44. The Q output signal of the flip-flop 44 is designated QC.

In partial description of the operation, the oscillator 34 provides output oscillations L which are counted in the counter 38. In conformance with common engineering parlance in describing the operation of binary logic circuits, we will term the higher of the two arbitrary voltages as the high or enabling voltage corresponding to binary one, and the lower as the low or non-enabling voltage corresponding to binary zero. Assuming that the counter 38 initially would have all its "one" outputs zero or in the low state, the initial signal not-CL would be high and the signal CL would initially be low. On the fifty-sixth count when the forth, fifth and sixth outputs of counter 38 all become high, not-CL becomes low and CL or the clock pulse becomes high or enabling. The signal CL thereupon remains high or enabling from the fifty-sixth through the sixty-third count inclusive, that is for eight counts. Thereupon not-CL goes high again and CL goes low. Thus the signal CL is high for eight counts out of sixty-four or one-eighth of the period of the low frequency oscillator thirty-four. The positive signal when CL is high may be termed the clock pulse.

When CL goes high its application to the clock terminal C of flip-flop 44 causes the low signal not-QC applied to its data input D to be transferred to the Q output, causing QC to go high, and not-QC to go low. QC now remains high until the next clock pulse begins, at which time QC becomes low. Therefore QC is high for 64 low frequency pulses L, and low each following 64 low frequency pulses L, beginning each high and low state each time that clock pulse CL commences its high state, i.e., at the beginning of each clock pulse. The period where QC is high may be termed a calibration cycle or period, and the period when QC is low may be termed a read cycle. As we shall see, correction can take place only during a calibration cycle.

As we shall see hereinafter, any one or more of the resistors R1 through R4 may be short-circuited by the transmission gates TG1 through TG4. The resistors are preferably so chosen, as in this case, that as each is substantially short-circuited by its associated transmission gate, the one-eighth period of the low frequency oscillator 34 is changed by approximately one period of the high frequency oscillator 18 of FIG. 1. The number of resistors may be greater if desired. Four of these resistors are shown as illustrative. Because of variations in resistive tolerances or for other reasons, the change in low frequency may cause more or less than a change of a single high frequency pulse in a one-eighth period of the low frequency oscillator, when switched in or out. It is apparent, nevertheless, that the oscillators are maintained in near-synchronism. The preparation for correction at count 4,080 of the high frequency oscillator is sufficiently early to allow for such variations.

Figure 3:
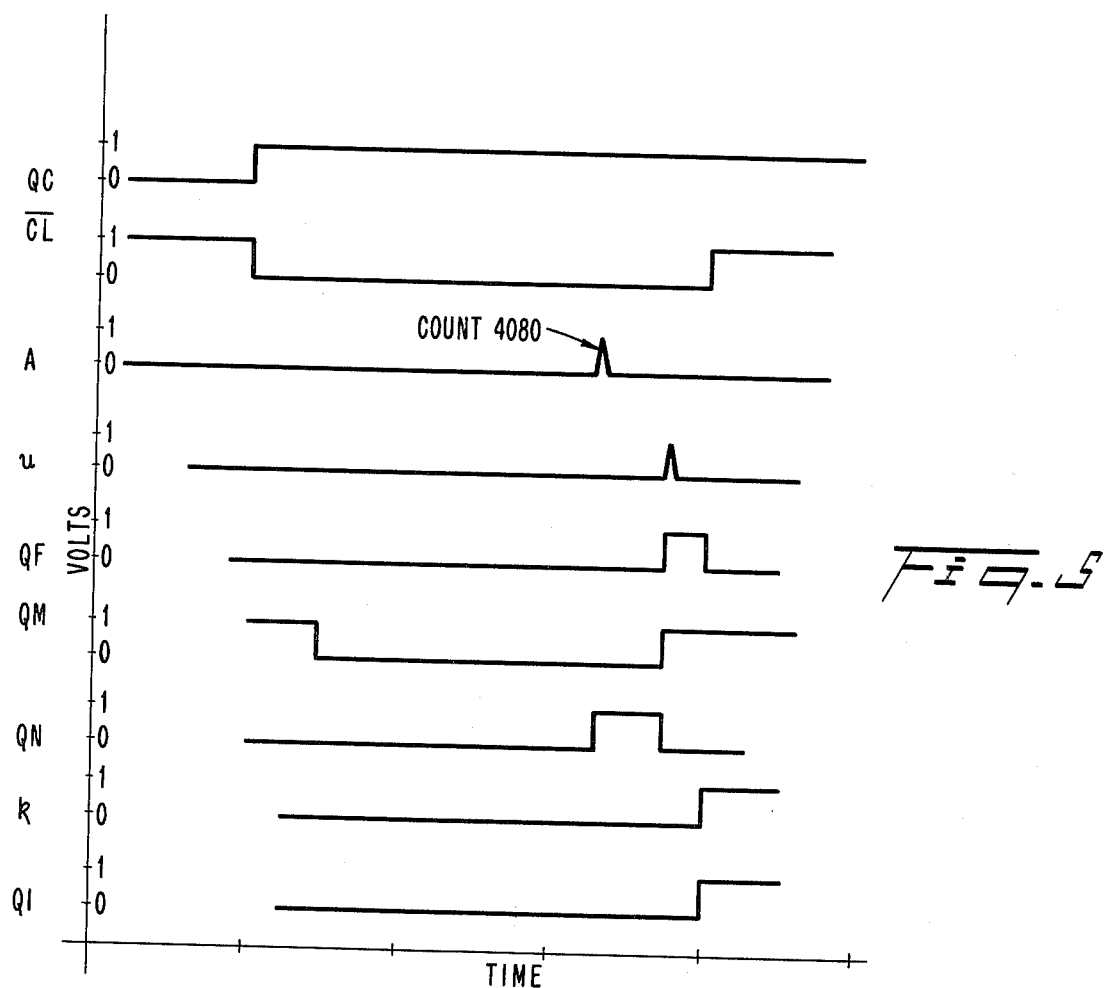
FIG. 3 is a logic diagram schematically illustrating a high frequency section of the block diagram of FIG. 1.

High Frequency Section 16 — FIG. 3

An inverter amplifier 50 has its output connected through a series connected variable capacitor C2 (quiescent or initial value about 68 micromicrofarads) and resistor R9 (100 kilohms) to one input of a two-input nand gate 56. The capacitor C2 may be formed of two plates 57 maintained parallel by a suitable mechanical linkage (not shown) and separated by a resilient means such as sponge rubber 59 or insulated helical coil compression spring. When a weight W is applied to the top plate the capacity is increased approximately in proportion to the change in the distance of separation of the plates. This and the other two-input nand gates are each one-fourth of an RCA type CD 4011. The output of the nand gate 56 is connected to the input of inverter amplifier 50. The output of nand gate 56 is also connected through resistor R8 (10 kilohms) to the junction between variable capacitor C2 and resistor R9. The other input to two-input nand gate 56 is received from a two-input nand gate 58 which has its two inputs connected respectively to receive the signal not-CL, heretofore described, and a signal not-QA ($\overline{QA}$) to be described hereinafter. The output of inverter amplifier 60, designated as not-H ($\overline{H}$) may be inverted in an inverter amplifier 62 to provide an output signal designated H (for high frequency) and may also be applied to a twelve-stage binary counter 64, the "one" outputs of which are indicated by B1, B2, etc. through B12. The twelve-stage binary counter 64 may consist of two six-stage binary counters, each using for example only six stages of a seven-stage RCA type CD 4024, so arranged that the overflow of one six-stage counter 66 acts as a trigger to enter a count in the succeeding one 68 also using only six states of seven-stage RCA tyep CO 4024. The reset terminals of the two six-stage counters 66 and 68 are connected to receive the output of a two-input nor circuit 70. Each two-input nor circuit herein is one-fourth of an RCA type CD 4001. The inputs to the two-input nor circuit 70 are respectively the clock signal CL and a signal QA to be described hereinafter. The signal not-H, the signals CL (from FIG. 2) the signal not-QC (from FIG. 2), and the signal QA are applied respectively to the four inputs of a four-input nand gate 72. Each four-input nand gate is one-half of an RCA type CD 4012.

The output of the four-input nand gate 72 is applied to a decimal counter 74 the output of which in turn may be applied to a decoder 76, the output of which is applied to a suitable seven-segment display device 78. As part of the high frequency section I include an automatic display on-off switch device 85 comprising a flip-flop 80 and a two-input nor circuit 82. Each two-input nor circuit is one-fourth of an RCA type CD 4001. The signals not-CL and non-A (A), the latter to be described hereinafter, are applied to the reset terminal R of the flip-flop 80. The clock input C of the flip-flop 80 receives the output from the second decimal digit output of the decimal display counter 74. The data input terminal D of the flip-flop 80 receives a constant positive voltage relative to circuit ground designated +V, which corresponds to a high or enabling voltage. The Q output from the flip-flop 80 is used to activate a switch which will trigger on the display 78 and decoder 76. The automatic display device is reset and turns the display device off when the clock signal CL is low and the signal A is high.

Now the signal A high indicates that the count of the high frequency oscillator pulses in counter 64 is at 4,080. Such a count can occur only if there has been no substantial change in variable capacitor C2 from its nominal value and enables the correction circuit to sense that a correction may be made and that no weighing is taking place. If by some mischance capacitor C2 is changed as someone is stepping on the scale in the midst of a count at or after the count of 4,080, a single increment correction only might occur before the weight is taken, introducing an error no greater than about one increment in the oscillator frequency of the high frequency oscillator which would be only about 0.024%. If weighing is occurring then variable capacitor C2 will change sufficiently that no high signal A can occur during a clock pulse, as will be clear hereinafter, no correction can take place. Thus no correction can occur during a weighing operation, except the remote possibility of the inadvertent and not significant one such as that mentioned above.

In partial description of the operation it will be apparent that the circuit comprising the inverter amplifier 50, capacitor C2, resistors R8 and R9, and nand gate 56 constitute an oscillator circuit 84 which is gated on or off by the output from the nand gate 58. When the output of nand gate 58 is high, the oscillator 84 receives feedback via resistor R9 and will oscillate with a period of oscillation determined in large part by the values of capacitor C2 and resistor R8. The output of the inverter 50 which corresponds to the high frequency oscillations H are inverted in the inverter amplifier 60 to provide signals not-H, which are again inverted in inverter 62 to provide signals H which are isolated from the oscillator 84 and will not effect its period of oscillation. As is apparent the signals not-H are actually counted as the high frequency signals. The twelve-stage binary counter 64 is reset at certain times to be described more fully hereinafter from the nor circuit 70. As will be more fully apparent hereinafter, when the period of oscillation of the high frequency oscillator 84 is changed substantially, as by a change in the value of capacitor C2 in the manner hereinbefore described, the nand gate 72 will permit the signals not-H to be counted during a read cycle (not-QC high) in the display counter 74. In other words, the high frequency oscillations will be counted in the display counter 74 whereupon a suitable count indicative of the change in the frequency of the oscillator 84 compared to the stabilized frequency of oscillator 34 may be made to appear in the display 78. The switch 85 is a device for saving power as it is contemplated that the arrangement may be used for a battery-powered personal weighing scale.

Figure 4:
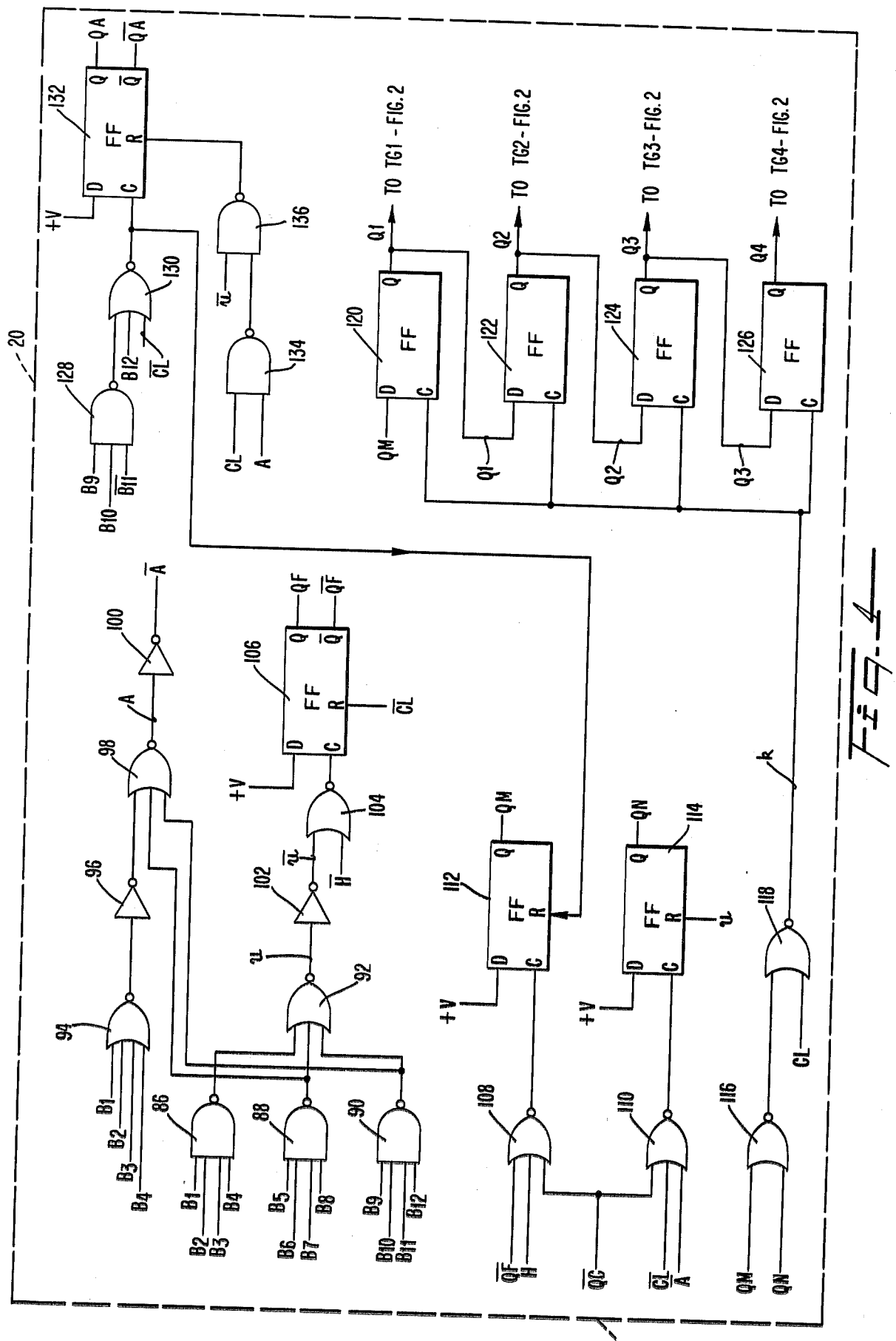
FIG. 4 is a logic diagram schematically illustrating certain correction circuitry of the block diagram of FIG. 1.

Correction Circuitry — FIG. 4

Referring to FIG. 4, the outputs from the twelve-stage binary counters 64 are applied to three, four-input nand gates 86, 88, and 90, the outputs B1 through B4 being applied to the respective inputs of nand gate 86, the outputs B5 through B8 being applied to the respective inputs of nand gate 88 and the four outputs B9 through B12 being applied respectively to the four inputs of nand gate 90. The three outputs of the nand gates 86, 88, and 90 are applied respectively to the three inputs of a three-input nor circuit 92. Each three input nor circuit herein is one-third of RCA type CD 4025. The outputs B1 through B4 are also applied respectively to the four inputs of a four-input nor circuit 94. Each of the four-input nor circuits herein is one-half of an RCA type CD 4012. The output of nor circuit 94 is applied to the input of an inverter amplifier 96, the output of which is applied to one input of a three-input nor circuit 98. The outputs from nand gate 88 and 90 are applied respectively to the two remaining inputs of nor circuit 98. The signal at the output of nor circuit 98 is designated A and when high indicates a count of 4,080 in the binary counter 64. The signal A is applied to the input of an inverter amplifier 100, the output of which is designated not-A ($\overline{A}$). The output of nor circuit 92 is designated U and when high indicates that the twelve-stage binary counter 64 of FIG. 3 contains the full count of 4,096. The signal U is applied to an inverter amplifier 102, the output of which is designated not-U ($\overline{U}$). The signal not-U and the signal not-H are applied to the two inputs of a two-input nor circuit 104 the output of which is applied to the clock input of a flip-flop 106. The input to the data terminal 106 is the plus or high drain voltage +V. The reset terminal of flip-flop 106 receives the signal not-CL. The Q output of the flip-flop 106 is a signal designated QF and the not-Q output of flip-flop 106 is designated not-QF ($\overline{QF}$). QF high indicates that a full count of 4,096 occurs in the binary counter 64 during the current clock pulse.

A three-input nor circuit 108 receives at its respective inputs the signal not-QF, the signal H, and the signal not-QC. A three-input nor circuit 110 receives at its respective three inputs the signal not-QC, the signal not-CL, and the signal not-A. A flip-flop 112 receives at its clock input the output of nor circuit 108 and a flip-flop 114 receives at its clock input terminal the output of nor circuit 110. The data input of both of these flip-flops 112 and 114 is connected to the high voltage +V. The reset terminal R of flip-flop 112 is connected to receive the output of a nor circuit 130 to be described. The reset terminal R of flip-flop 114 is connected to receive the signal U. The Q output of the flip-flops 112 and 114 are designated QM and QN respectively.

The signals QM and QN serve as respective inputs for the two input nor circuit 116. The output of nor circuit 116 is connected to one input of the two input nor circuit 118, the other input terminal of which receives the clock signal CL. The output of the nor circuit 118 is the correction signal k and is applied to the clock input terminal C of each of four flip-flops 120, 122, 124, and 126. The data input to flip-flop 120 is the signal QM. The data inputs to the respective flip-flops 122, 124, and 126 are designated Q1, Q2, Q3, being the respective Q outputs of the flip-flops 120, 122, and 124. Thus the flip-flops 120, 122, 124, and 126 are connected in shift register fashion. The Q outputs Q1, Q2, Q3, and Q4 from the respective flip-flops 120, 122, 124, and 126 are, as heretofore described, the signal inputs to the transmission gates TG1, TG2, TG3, and TG4 of the low frequency section of FIG. 2.

Still referring to FIG. 4, the outputs B9 and B10 from the twelve-stage binary counter 64 of FIG. 3 are two inputs respectively for a three-input nand gate 128, the other input of which is not B-11 ($\overline{B11}$) from the same counter, which may be developed from the eleventh binary output of the twelve-stage binary counter 64 passing the signal B11 through an inverter amplifier, or by taking the output from the "zero" terminal of the eleventh stage of the twelve-stage binary counter 64. The output of the nand circuit 128 (FIG. 4) is applied as one input to a three-input nor circuit 130; the other inputs to nor circuit 130 are the signal not-CL, and the output B12 of the twelve-stage binary counter 64 of FIG. 3. The output of nor circuit 130 (FIG. 4) is applied to the clock terminal of a flip-flop 132. The data input terminal of flip-flop 132 is connected to the high voltage +V. A two-input nand gate 134 receives the clock signal CL and the signal A respectively at its two inputs. Its output is applied to one input of a two-input nand gate 136, the other input of which is the signal not-U. The output of nand gate 136 is applied to the reset terminal of flip-flop 132. The Q output of the flip-flop 132 is designated QA and the not-Q output of the flip-flop 132 is designated not-QA ($\overline{QA}$).

Consideration of the logic associated with nand circuits 86, 88, and 90 and nor circuit 92 shows that the signal U will indicate that the twelve-stage binary counter 64 of FIG. 3 is full, that is that all of the "one" terminals are high, indicating a count of 4,096 from an initial stage in which all of the "one" terminals are zero. The not-U signal indicates that the twelve-stage binary counter 64 is in some other condition. The concurrence of a high U (low not-U) and high H (low not-H) signals, therefore, causes the output QF of flip-flop 106 to be high and the not-QF output to be low when the twelve-stage binary counter 64 registers a full count, the high frequency oscillator is running, and the current clock pulse is not concluded. The flip-flop 106 is reset and the signal QF goes low when not-CL goes high, that is, at the termination of the clock pulse.

Considering the logic of the nand circuits 88 and 90 and the nor circuit 94, the inverter 96 and the nor circuit 98, it will be apparent that the signal A goes high whenever the twelve-stage binary counter 64 contains a count 16 less than full (4,080) starting from an initial count of zero and is otherwise low. The signal not-A therefore represents any different state of the twelve-stage binary counter 64, namely any count between zero and 4,096 except for 4,080.

Observing the nand gate 128 and the nor circuit 130, it is apparent that the flip-flop 132 will receive a positive enabling voltage at its clock terminal C when the twelve-stage binary counter reaches a count of 768, which is relatively early in the cycle compared to the full signal U or the A signal representing that the count has reached 4,080. At this point in the cycle of the twelve-stage binary counter if the clock signal CL is high, then the signal QA indicates that the 768th pulse has been reached; the signal QA then remains high only until the flip-flop 132 is reset by the A signal at the count of 4,080 with clock signal CL high. A low not-U (high full signal U) will also reset flip-flop 132. The signal U will occur, as will appear hereinafter, at the conclusion of each weighing cycle. As shall be observed hereinafter, a high signal QA pertains when the high frequency capacitor C2 has increased substantially in capacity thereby reducing the frequency and increasing the period of the high frequency oscillator 84 by a substantial amount. The high signal QA may then be an indication that a measurement should be taken, the count 768 being less than 4,096 by a deficiency (or amount) greater than could be reasonably expected with no measurement being taken and C2 remaining near its nominal value under any expected ambient condition.

Considering the nor circuit 108 and the flip-flop 112, we see that the latter is reset early (at a count of 768 in counter 64) in each cycle that clock signal CL goes high, at the same time that QA goes high. Then QM is clocked to a high state if QF is high, signal H is low, and signal QC is high (during a calibrate cycle).

Considering nor circuit 110 and flip-flop 114, we see that the latter is reset by the high full signal U. The flip-flop 114 is clocked by a high signal from nor circuit 110 when CL is high, A is high (at the count of 4,080) and QC is high (during a calibrate cycle).

Thus comparing the states of flip-flops 112 and 114, after the A signal during a calibrate cycle, until a full count signal U is high, signal QN is high and signal QM low. After the full count, QM is low and QN is also low, until the following high frequency pulse. Hence if the full count of 4,096 high frequency pulses occurs within one high frequency pulse period after the end of the low frequency calibration cycle, both signals QN and QM are low, and the output from nor circuit 116 is high, that from nor circuit 118 is low, and the correction signal k remains low. No correction then takes place.

Accordingly if the flip-flop 120 is in a state in which its output Q1 is low and its input QM is high, then when the correction signal k of nor circuit 118 goes high, the high value of QM is transferred to the Q output, Q1, of flip-flop 120. When Q1 goes high the transmission gate TG1 of FIG. 2 shortcircuits the resistor R1 thereby decreasing the period of the low frequency oscillator 34. If the 4,096th pulse in the high frequency binary decimal counter 64 still occurs before the clock pulse next goes low on the next cycle (recalling that QM goes high only on alternate cycles of clock signal CL) then the next time the output signal from nor circuit 118 goes high the high value of Q1 is transferred into the flip-flop 122 and the output Q2 goes high. The flip-flops 124 and 126 remain low because the outputs Q2 and Q3 applied to the data terminals of flip-flops 124 and 126 respectively were at that time in a low state. Accordingly if there are at least 4,080 high frequency pulses within the calibration pulse period CL high, but more than 4,096, the resistors R1, R2, R3, and R4 will be short-circuited one at a time causing the selected pulse period CL to decrease each time bringing the two oscillators nearer into synchronism.

Similarly, if after the 4,080th high frequency pulse is counted in the twelve stage binary counter 64 and then a 4,096th pulse is counted giving a U signal, QM will be low and cause Q1 to go low and the transmission gate TG1 is open-circuited causing R1 to be added into the resistance of the frequency determining part of the low frequency oscillator increasing by one increment its period, and particularly the selected calibration cycle when CL is high.

An examination of the circuits indicates that there are circumstances when a correction is desired, but none occurs when correction signal k goes positive. For example assume flip-flops 120, 122, and 124 to be in their "zero" states in which all have low Q outputs and flip-flop 126 is in its high state and has a high Q output. If QM is high the next time correction clock signal k is positive going, Q1 goes high, but the low output of flip-flop 124 is transferred through the data input of flip-flop 126 to the output Q4. Accordingly although the resistor R1 has now been removed from the circuit, the resistor R4 has been added and there has been no incremental change in the frequency of the low frequency oscillator 34. On the other hand on the next cycle the resistance between R6 and the junction of C1 and R5 will be reduced and the low frequency period reduced an incremental amount as desired.

OPERATION

Case I — Low Frequency Period Too Long (FIG. 5)

Overall operation should now be apparent from what has been described heretofore. In this example the frequency of the low frequency oscillator 34 was designed to be approximately 100 Hertz. CL is high for about 80 millisec. by the action of counter 38 and gate 40. The high frequency oscillator 84 was designed to operate at 51 KHZ. The period for a single complete high frequency oscillation H is approximately 19.6 microsec. The 4,096 pulses of H (or of not-H) then take approximately 80 millisec. Obviously if desired a greater number of resistors R1, R2, R3, and R4 may be employed in the circuit to permit a greater initial disparity in the 4,096 high frequency pulses and the approximately 80 millisec. of the low frequency period.

Let us suppose that the low frequency period is a little long. Suppose the clock pulse CL (FIG. 2) goes high initiating a calibration cycle, i.e., at a time when signal QC goes high. The units on the diagrams do not indicate absolute voltage values. At the same time the signal not-CL will go low, as shown in FIG. 5. The nand gate 58 of FIG. 3 output is then high. We may assume QA is low also. The high frequency counter 64 had been reset when CL was last low and QA also low. The high frequency oscillator 84 of FIG. 3 is now gated on and the counting of the high frequency oscillations in the twelve-stage binary counter 64 begins. At count 768 flip-flop 112 is reset and QM is low. Assume now that the count exceeds 4,080, that is 16 counts before the binary counter 64 is full. Under these circumstances a signal A (FIG. 4) occurs at the count 4,080 as shown in FIG. 5. It lasts only for one high frequency period. With clock signal CL and calibration signal QC both high, flip-flop 114 is clocked and QN goes high (see FIGS. 4 and 5). Soon after, the high frequency binary counter 64 (FIG. 3) becomes full because the low frequency period is too long compared to the high frequency period. The pulse U generated at the output of nor circuit 92 of FIG. 4 for a high frequency period then causes signal QF from flip-flop 106 (FIG. 4) to go high, and resets flip-flop 114 to cause QN to go low. The next high frequency pulse not-H gated by high signal QF at nor circuit 108 sets flip-flop 112 (FIG. 4) causing QM to go high. With signal QN low, when QM goes high, and as CL goes low correction signal k clocks the high value of QM into the Q output of flip-flop 120 thereby enabling the gate TG1 of FIG. 2. The resistor R1 is now effectively short-circuited and the period of the low frequency oscillator 34 is reduced. Preferably this period is reduced by such an amount that the selected portion (one eighth) of the low frequency period is shortened by a time approximately equal to a high frequency oscillation, that is approximately 19.6 microsecs. The low frequency period is reduced by about 160 microsecs. The continuation of this process thus reduces the frequency of the low frequency oscillator by increments approximately equal to a period of the high frequency oscillator in the selected portion of the low frequency period.

Figure 6:
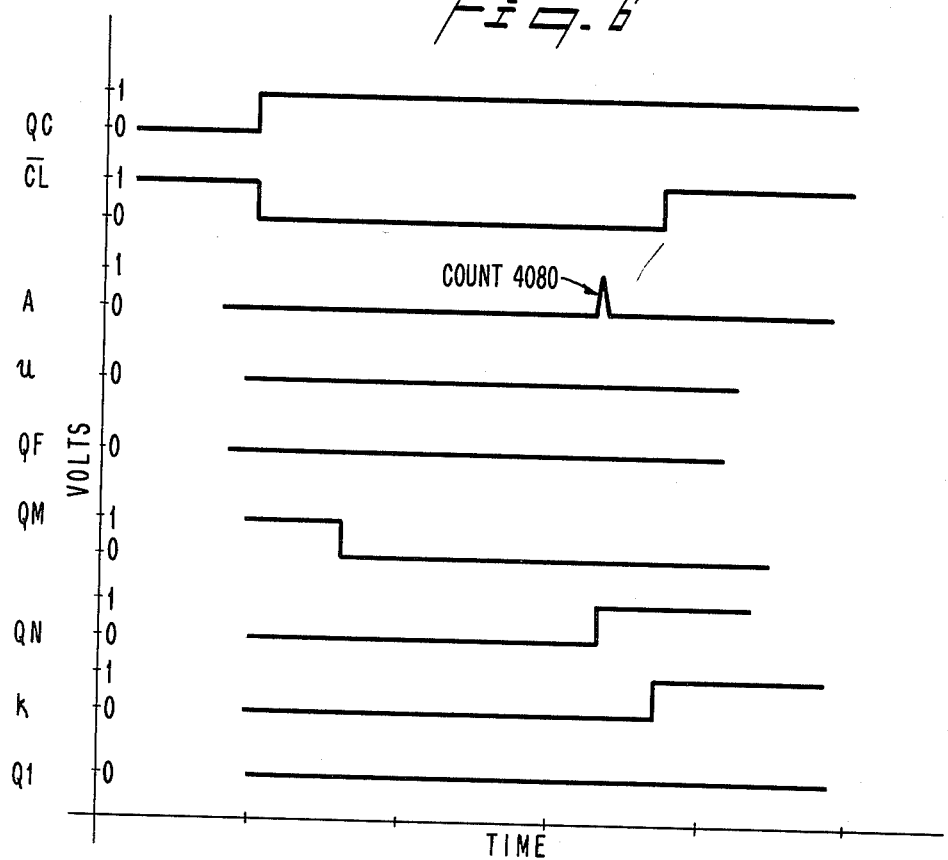

Case II — Low Frequency Period Short (FIG. 6)

If the selected portion corresponding to the time the clock signal CL is high is too short for the high frequency pulses not-H to fill the twelve-stage binary counter 64 of FIG. 3, then recall that signal A (see also FIG. 6) from the nor circuit 98 of the correction circuitry of FIG. 4 goes high at the 4,080th high frequency pulse. Recall that flip-flop 112 had been reset at count 768 in the binary counter 64. With calibration signal QC and clock signal CL high, when signal A goes high, flip-flop 114 is clocked and signal QN goes high. Considering the nor circuits 116 and 118 of FIG. 4 with QM low and QN high, as CL goes low, the correction signal k going positive is applied to and clocks the flip-flops 120, 122, 124, and 126. The correction signal k being applied to the circuit 120 enters the now low value of QM, corresponding to a logic zero into the flip-flop 120 and Q1 now goes low. As a result the transmission gate TG1 of FIG. 2 is made inactive and the resistor R1 is inserted into circuit in the low frequency oscillator 34. Accordingly the frequency of the low frequency oscillator 34 is now increased; its period is increased by one increment calculated to be approximately equal in one calibration period to one period of the high frequency oscillator 84. The values Q1, Q2, and Q3 are respectively stepped to be Q2, Q3, and Q4.

It may happen, for example that before this correction is made, we have a condition with Q3 high and Q4 low. Then the change in state of flip-flop 120 is compensated for by the change in state of flip-flop 126. Under this circumstance the total resistance in the chain of resistors R1 through R4 is not altered. Nevertheless it is apparent that on a succeeding cycle the change in frequency of the low frequency section will commence to occur an increment at a time.

Figure 7:
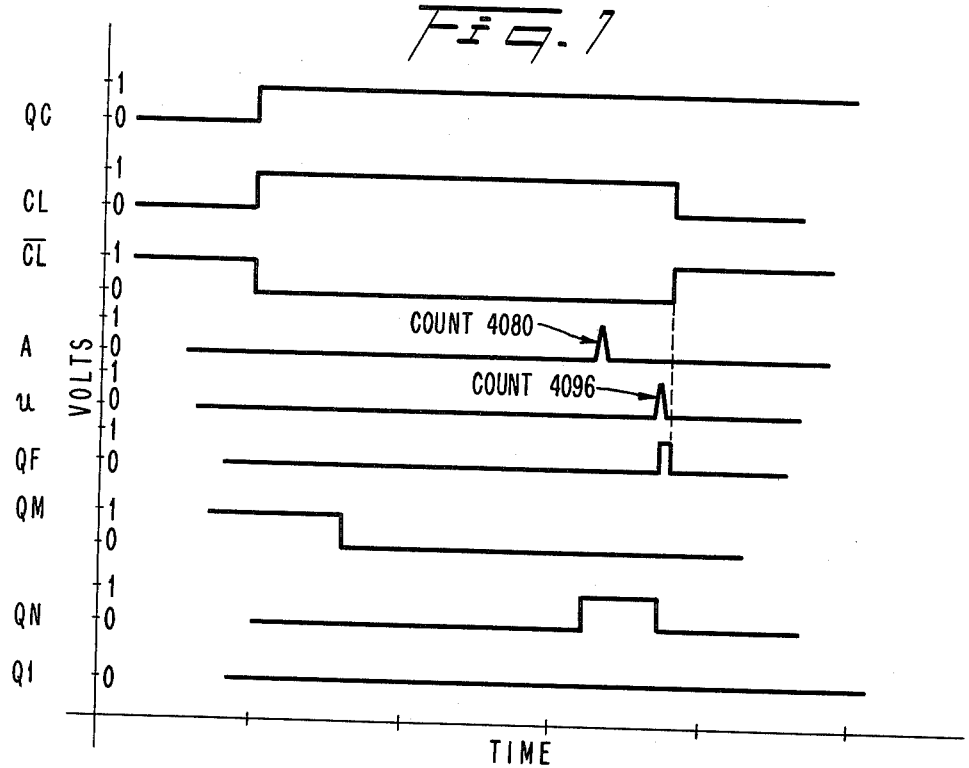

Case III — Oscillators in Near Synchronism (FIG. 7)

It will now be apparent that when the number of pulses is greater than 4,096 within the selected period and the period of low frequency oscillator 34 is too long, that it will be decreased by an increment. Conversely when the period of the low frequency oscillator 34 is too short and the 4,096th pulse is not reached within the selected period of the low frequency oscillator, the period of the low frequency oscillator will be increased by an increment. Therefore eventually the two oscillators are brought into near synchronism to a condition in which the 4,096th high frequency pulse occurs within the last high frequency cycle of the selected portion of the low frequency oscillator period. Because the oscillators are free running, eventually the low frequency period will become too long or too short. When this happens, the oscillators are again brought into near synchronism an increment at a time.

The situation which prevails when the count of 4,096 is reached within one high frequency pulse period before the end of the selected portion of the low frequency period is illustrated in FIG. 7. The pulse A from nor circuit 90 of FIG. 4 occurs 16 high frequency periods before the termination of the signal CL high. The signal U goes high at approximately the time or just preceding the time when the signal CL goes low, within one increment. As before the signal QM goes low and the signal QN goes high substantially coincidentally with the signal A going high. High signal A with signal CL high has also reset flip-flop 132 making QA low. The signal QF goes high with the signal U and continues high until the conclusion of the high signal CL. Signal QN goes low with high signal U. With both signals QN and QM low, signal k is low, and the frequency of the low frequency oscillator remains unchanged by action of the flip-flops 120, 122, 124, and 126 and transmission gates TG1, TG2, TG3, and TG4. These flip-flops and transmission gates remain in whatever state they were.

Case IV — Measurement

We may assume, because of the operation thus far described, that the two oscillators are in near synchronism just before a weight is applied. Let us now examine the action of the circuit when a weight is applied and the capacitor 52 is increased substantially. The high frequency period is increased to such an extent that the signal A is not reached before the end of the selected portion of the low frequency period with clock signal CL high. Instead at the count of 768 (see the nand gate 128 and the nor circuit 130 and their inputs of FIG. 4) the flip-flop 132 receives a signal at its clock terminal at count 768 of the binary counter and the constantly applied plus voltage (equal to the drain voltage) at the digit terminal is transferred to the Q output, so that the signal QA becomes high. With the signal QA high, the signal not-QA is low. As a result the nand gate 58 (FIG. 3) does not gate off the high frequency oscillator 84 at the termination of the clock signal CL, that is when CL goes low and not-CL goes high as is otherwise the case. Instead the high frequency oscillator 84 continues to run. At the same time with QA high the nor circuit 70 (FIG. 3) cannot reset the high frequency twelve-stage binary counter 64, because signal QA is high. With not-QC high, that is during one of the alternate cycles, the read cycle, of the clock signal CL during which calibration cannot take place, and signal QA high, and signal not-CL high, high frequency pulses as signals not-H are passed through the nand circuit 72 to the display counter 74, which counts them starting with clock signal CL going low. The count continues until the full signal U goes high. Then flip-flop 114 of FIG. 4 is reset and QN goes low. The output of nand gate 136 (FIG. 4) goes high to reset the flip-flop 132 whereupon QA goes low and not-QA goes high. As soon as QA goes low the nand circuit 72 terminates the count in the display counter 74. Assume that the period of the low frequency oscillator does not change significantly in the time required to take a measurement. Let the clock period when CL is high be T, the old frequency of the high frequency oscillator be $f_o$ and the new frequency of the high frequency oscillator $f_n$, then the count N in the display counter, when U goes high, is $4096 - (f_n \times T)$. Also we have assumed $f_o \times T = 4,096$. Consequently $$N = 4{,}096 - \left(\frac{f_m}{f_o} 4096\right) \text{ and } f_m = f_o \frac{(4096 - N)}{4096}.$$

Hence the new frequency may be deduced in terms of the old frequency and the count in the display counter. Observe that soon after the display counter 74 starts to count, the flip-flop 80 (FIG. 3) generates an output signal from its Q terminal which switches the display on. This switching action of flip-flop 80 is to save on the power required for the display. The output from the display counter 74 is decoded in a decoder 76 and displayed for example in a seven-segment display 78. Description of the details of the decoder 76 and display device 78 are not necessary for an understanding of the invention. A display will be excited each time weighing takes place and during and only during each read cycle. Moreover although the display may read varying numbers as the weight is being applied or increased, it will eventually stabilize when the weight stabilizes at least in the more significant digits, repetitively displaying a like value for visual observation.

If the plate separation of the weighing capacitor was initially a separation of DO with its own initial weight WO and a lesser separation DI with an additional weight applied, then DI-DO we may assume is at least approximately directly proportional to WI-WO, i.e., the additional weight W to be weighed. For a two plate capacitor, the capacity C is proportional to the inverse of the plate separation. The time constant of the high frequency oscillator is R × C. Frequency is proportional to the inverse of the time constant and therefore is proportional to the plate separation, since R is fixed. Hence the difference in frequency $f_n - f_o$ is proportional to DI - DO, and to the weight to be weighed. Thus the count in the display counter may be related, with suitable calibration, to the weight. For calibration consider that we have two variables, the initial value of capacitance of capacitor C2, and the "weight" of the counts. Purely by way of illustration, suppose a weight of 100 pounds deflects the capacitor plates of capacitor C2 so that the change in frequency gives a count in the display counter of 1,000. A divide-by-ten scale will give the correct direct-reading value of 100. Thus the initial point (initial value of capacitance of capacitor C2) and a second point (in pounds or kilograms) give a linear scale for direct reading.

As it is generally contemplated that the two oscillators will be in the same ambient conditions, after they have been near synchronized, no substantial drift is likely to occur. As soon as the weight is removed from the scale the circuit returns to its prior operation.

CONCLUSION

It will be apparent from the foregoing that there has been disclosed a method and means for measuring which are novel and which have appreciable advantages. Although the circuits have been described as built of CMOS discrete circuits, it will be appreciated that they are especially well suited to establishment on one or more integrated circuit chips. The circuits avoid the requirement of high capacitors, except possibly for the weighing instrument itself and therefore avoid the need for using discrete components in general.

What is claimed is:

1. In combination, a low frequency oscillator, a high frequency oscillator gated by said low frequency oscillator for a selected portion of a period of said low frequency oscillator, one of said oscillators being correctible in increments, a plurality of electrical elements, a counter counting the oscillations of said high frequency oscillator during said selected gated portions, means, including means for selectively individually connecting or disconnecting said elements from said correctible oscillator, and responsive to the count in said counter during said portion in excess or in deficiency of a selected count for said selected gated portion to increase or decrease and thereby correct the frequency of the correctible oscillator by an increment, whereby the high frequency oscillator is brought into near synchronism after a number of such corrections with said low frequency oscillator to within a high frequency period during said portion of a low frequency period.

2. In combination, a low frequency oscillator, a high frequency oscillator gated by said low frequency oscillator for a selected portion of a period of said low frequency oscillator, one of said oscillators being correctible in increments, each of said increments being substantially equal to a desired time period, a counter counting the oscillations of said high frequency oscillator during said selected gated portions, means responsive to the count in said counter for said portion in excess or in deficiency of a selected count for said selected gated portion to increase or decrease and thereby correct the frequency of the correctible one of said oscillators by an increment, whereby the high frequency oscillator is brought into near synchronism after a number of such corrections with said low frequency oscillator to within a high frequency period during said portion of a low frequency period, said increment being substantially equal to one period of said high frequency oscillator.

3. A combination as claimed in claim 2, said means responsive to the count in said counter including a circuit having an output signal in response to a full count in said counter.

4. A combination as claimed in claim 2, said means responsive to the count in said counter including a circuit having an output signal in response to a full count in said counter less a selected deficiency count.

5. A combination as claimed in claim 2, said means responsive to the count in said counter including a circuit having an output signal in response to a full count in said counter and a circuit responsive to a full count in said counter less a selected deficiency.

6. A combination as claimed in claim 2, the desired time period of said increments each being substantially equal to one period of oscillation of said high frequency oscillator.

7. In combination, a low frequency oscillator, a high frequency oscillator gated by said low frequency oscillator for a selected portion of a period of said low frequency oscillator, one of said oscillators being correctible in increments, a counter counting the oscillations of said high frequency oscillator during said selected gated portions, means responsive to the count in said counter for said portion in excess or in deficiency of a selected count for said selected gated portion to increase or decrease and thereby correct the frequency of the correctible one of said oscillators by an increment, substantially equal to a period of said high frequency oscillator, whereby the high frequency oscillator is brought into near synchronism after a number of such corrections with said low frequency oscillator to within a high frequency period during said portion of a low frequency period, said means responsive to the count in said counter being operable only on alternate periods of said low frequency oscillator.

8. In combination, a low frequency oscillator, a high frequency oscillator gated by said low frequency oscillator for a selected portion of a period of said low frequency oscillator, one of said oscillators being correctible in increments, a counter counting the oscillations of said high frequency oscillator during said selected gated portions, means responsive to the count in said counter for said portion in excess or in deficiency of a selected count for said selected gated portion to increase or decrease and thereby correct the frequency of the correctible one of said oscillators by an increment, whereby the high frequency oscillator is brought into near synchronism after a number of such corrections with said low frequency oscillator to within a high frequency period during said portion of a low frequency period, said means responsive to the count in said counter comprising a group of flip-flops connected in shift-register fashion, said correctible oscillator having frequency determining components responsive to the states of said flip-flops.

9. In combination, a low frequency oscillator, a high frequency oscillator gated by said low frequency oscillator for a selected portion of a period of said low frequency oscillator, one of said oscillators being correctible in increments, a counter counting the oscillations of said high frequency oscillator during said selected gated portions, means responsive to the count in said counter for said portion in excess or in deficiency of a selected count for said selected gated portion to increase or decrease and thereby correct the frequency of the correctible one of said oscillators by an increment, whereby the high frequency oscillator is brought into near synchronism after a number of such corrections with said low frequency oscillator to within a high frequency period during said portion of a low frequency period, said correctible oscillator comprising a frequency determining circuit, having a frequency determining element including a group of series connected resistors, said means responsive to the count in said counter comprising a group of transmission gates separately paralleling said resistors, whereby the state of said gates determines the frequency of said correctible oscillator.

10. A combination as claimed in claim 9, said means responsive to the count in said counter comprising a group of flip-flops connected in shift-register fashion, the said transmission gates being connected to respond to the states of said flip-flops.

11. A combination as claimed in claim 10, said correctible oscillator being the low frequency oscillator.

12. Apparatus for measuring a desired parameter or the like comprising a pair of free running oscillators one being correctible, and one having a higher frequency than the other and gated to be responsive to the lower frequency oscillator to oscillate for a selected portion of each period of the lower frequency oscillator oscillations, one of said oscillators having a component having an electrical characteristic related to said parameter to which the oscillator frequency is responsive, a counter to count the higher frequency oscillations for said selected portion of a period, and means responsive to a count greater than a selected count in said counter to correct the period of oscillations of the correctible one of said oscillators by a selected increment and to a count in said counter less than said selected count to oppositely correct the period of oscillations of said correctible oscillator by an equal said increment, whereby the period of said correctible oscillator is corrected so that the portion of the period of said lower frequency oscillator is a selected multiple, corresponding to the selected count, of the period of said higher freqeuncy oscillator within one increment, and means effective when said electrical characteristic is changed and a desired measurement is to be made to disconnect the non-correctible oscillator from the correctible oscillator and to count the oscillations of one oscillator against the other as a standard thereby to provide a measure of the change in said characterisitc and of a related parameter.

13. Apparatus as claimed in claim 12, said one increment being substantially equal to one high frequency period.

14. Apparatus as claimed in claim 13, said correctible oscillator being the low frequency oscillator.

15. Apparatus as claimed in claim 13, said oscillator having said component being the high frequency oscillator.

16. Apparatus as claimed in claim 15, said component being a capacitor.

17. Apparatus as claimed in claim 16, said apparatus being a scale, said parameter being weight, said component comprising a capacitor having capacity as said characteristic and comprising a pair of plates resiliently separated, the distance of separation and the resultant capacity being responsive to the weight applied.

18. Apparatus as claimed in claim 14, said oscillator having said component being the high frequency oscillator.

19. Apparatus as claimed in claim 18, said means responsive to the count in said counter comprising a circuit responsive to a full count in said counter and a circuit responsive to a full count in said counter less a selected deficiency.

20. Apparatus as claimed in claim 19, said low frequency oscillator having a frequency determining circuit comprising a group of resistors connected in series, said means responsive to the count in said counter comprising a group of flip-flops connected in shift-register fashion and a group of transmission gates connected to receive separately the outpt of said flip-flops, said gates being connected separately in parallel with said resistors.

21. Apparatus as claimed in claim 13, said means effective when said characteristic is changed comprising means responsive to a count in said counter less than said selected count by an amount greater than any expected deficiency when said characteristic is unchanged.

22. A method of bringing two free running oscillaors into near synchronism comprising the steps of counting the oscillations of one oscillaor during a selected porton of a period of the other oscillator, determining whether the number of oscillations thus counted is in excess or deficieny of a selected count, correcting the freqeuncy of one of the oscillators by an increment always equal to a desired time period in response to the excess or deficiency of the count thus determined in a direction to reduce the excess or deficiency, and repeating these steps until the count corresponds to the selected count, whereby the two oscillators are brought into near synchronism.

23. A method as claimed in claim 22, each said increment being substantially equal to a period of oscillation of said high frequency oscillator.

24. A method of bringing two free running oscillators, one of higher frequency of oscillations than the other, into near synchronism comprising the steps of counting the oscillations of one of said oscillators during a selected portion of a period of the other of said oscillators, determining whether the number of oscillations thus counted is in excess or deficiency compared to a selected count, correcting the frequency of the lower frequency oscillator by connecting or disconnecting discrete electrical elements by an increment in response to the excess or deficiency thus determined and in a direction to reduce the excess or deficiency, and repeating these steps until the count corresponds to the selected count, whereby the two oscillators are brought into near synchronism.

25. A method as claimed in claim 24, wherein the increment is substantially equal to a period of the higher frequency oscillator.

26. A method as claimed in claim 24, wherein the steps are repeated every nth occurrence of said selected portion of a period of said low frequency.

27. A method as claimed in claim 26, wherein n is two, whereby the steps are repeated every other period of said low frequency oscillations.

* * * * *